US007802159B1

(12) United States Patent
Chakravarty et al.

(10) Patent No.: US 7,802,159 B1
(45) Date of Patent: Sep. 21, 2010

(54) ENHANCED LOGIC BUILT-IN SELF-TEST MODULE AND METHOD OF ONLINE SYSTEM TESTING EMPLOYING THE SAME

(75) Inventors: Sreejit Chakravarty, Mountain View, CA (US); Narendra Devta-Prasanna, Bangalore (IN); Fan Yang, Redwood City, CA (US)

(73) Assignee: LSI Corporation, Milpitas, CA (US)

( * ) Notice: Subject to any disclaimer, the term of this patent is extended or adjusted under 35 U.S.C. 154(b) by 246 days.

(21) Appl. No.: 12/170,030

(22) Filed: Jul. 9, 2008

(51) Int. Cl.
*G01R 31/28* (2006.01)
(52) U.S. Cl. .................................... 714/731; 714/733
(58) Field of Classification Search ................. 327/202; 365/154; 714/326, 729, 727, 730, 731, 733
See application file for complete search history.

(56) References Cited

U.S. PATENT DOCUMENTS

| | | | | |
|---|---|---|---|---|
| 6,433,601 | B1* | 8/2002 | Ganesan | 327/202 |
| 7,234,090 | B2* | 6/2007 | Blasi et al. | 714/726 |
| 7,551,475 | B2* | 6/2009 | Agarwal et al. | 365/154 |
| 2003/0074616 | A1* | 4/2003 | Dorsey | 714/733 |
| 2009/0307548 | A1* | 12/2009 | Forlenza et al. | 714/729 |

OTHER PUBLICATIONS

R.L. Wadsack "Fault Modeling and Logic Simulation of CMOS and MOS Integrated Circuits" Bell Syst. Tech. Journal, vol. 57, pp. 1449-1474, May-Jun. 1978.
Paul H. Bardell, et al., "Self-Testing of Multichip Logic Modules" IEEE International Test Conference, pp. 200-204, 1982.
Bernd Konemann, et al., "Built-In Logic Block Observation Techniques" IEEE International Test Conference, 1979, pp. 37-41.
Slawomir Pilarski, et al., "Estimating Testing Effectiveness of the Circular Self-Test Path Technique" IEEE Transactions on Computer-Aided Design vol. 11, No. 10, Oct. 1992, pp. 1301-1316.
Samy R. Makar, et al., "Checking Experiments to Test Latches" Proc. VLSI Test Symp., pp. 196-201, 1995.
Samy Makar, "Checking Experiments for Scan Chain Latches and Flip-Flops" CRC Technical Report 96-5, Aug. 1996.

* cited by examiner

*Primary Examiner*—David Ton (57) ABSTRACT

A logic built-in self-test (LBIST) module and a method of online system testing. In one embodiment, the LBIST module includes: (1) first and second data sources selectable to provide alternative respective first and second data to at least one scan chain and (2) a scan clock modifier associated with the first and second data sources and configured to drive the at least one scan chain with a selectively aperiodic modified scan clock signal.

20 Claims, 8 Drawing Sheets

ENHANCED LOGIC BUILT-IN SELF-TEST MODULE AND METHOD OF ONLINE SYSTEM TESTING EMPLOYING THE SAME

TECHNICAL FIELD

The invention is directed, in general, to and, more specifically, to an enhanced logic built-in self-test (LBIST) module and a method of online system testing that employs the module.

BACKGROUND

Periodic testing calls for an electronic system, most often embodied in one or more integrated circuits (ICs) to be intermittently tested during its service life. The system periodically invokes self-test modules (sometimes called infrastructure IPs) that are integrated with the system and designed to test functional circuits in the system when invoked. The result of the self-test is then sampled to determine if any circuit in the system has failed.

The objective of periodic testing is to uncover defects that could occur due to wear and tear resulting from normal use (its "functional mode") over time. In contrast to critical path monitoring, in which critical path monitors (CPMs) continuously monitor specific paths in a system while it is functioning, periodic testing employs the self-test modules to generate specific tests to detect the presence of new defects.

LBIST takes the form of a self-test module that is integrated into the ICs of a particular system and used for periodic testing. The objective of LBIST-based periodic testing is to uncover defects that could occur due to the wear and tear of the system. Open defects fall in this category (see, e.g., Wadsack, "Fault Modeling and Logic Simulation of CMOS and NMOS Integrated Circuits," Bell Syst. Tech. Journal, Vol. 57, May-June 1978, pp. 1449-1474). Open defects are unintended high-impedance faults (e.g., stuck-open and stuck-at faults) occurring in the devices, including transistors, or the conductors (e.g., traces and vias) that interconnect them.

Figure 1A:
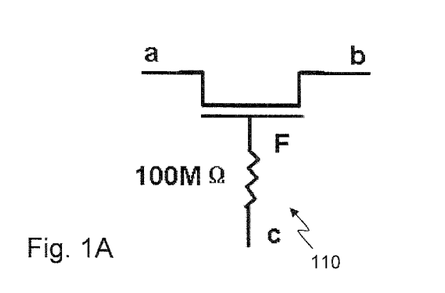
FIGS. 1A-B are simplified schematic diagrams of transistors containing open defects.
Figure 1B:
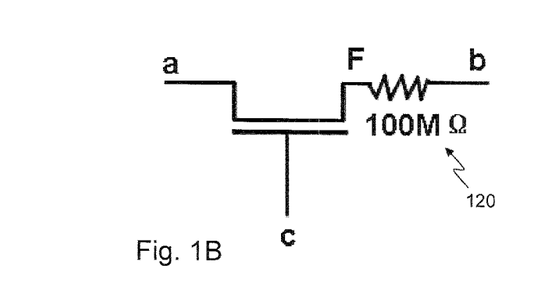

FIGS. 1A and 1B are simplified schematic diagrams of transistors containing open defects. FIG. 1A contains an open defect F 110 exhibiting, e.g., a 100 MΩ impedance involving a gate c thereof. FIG. 1B contains an open defect F 120 exhibiting, e.g., a 100 MΩ impedance involving a source or drain b thereof. Gate open defects often result due to the breakdown of interconnects (e.g., vias) driving the gate of the transistor. Open source or drain defects often result from electro-migration stemming from source-drain currents flowing through the transistor.

Figure 2:
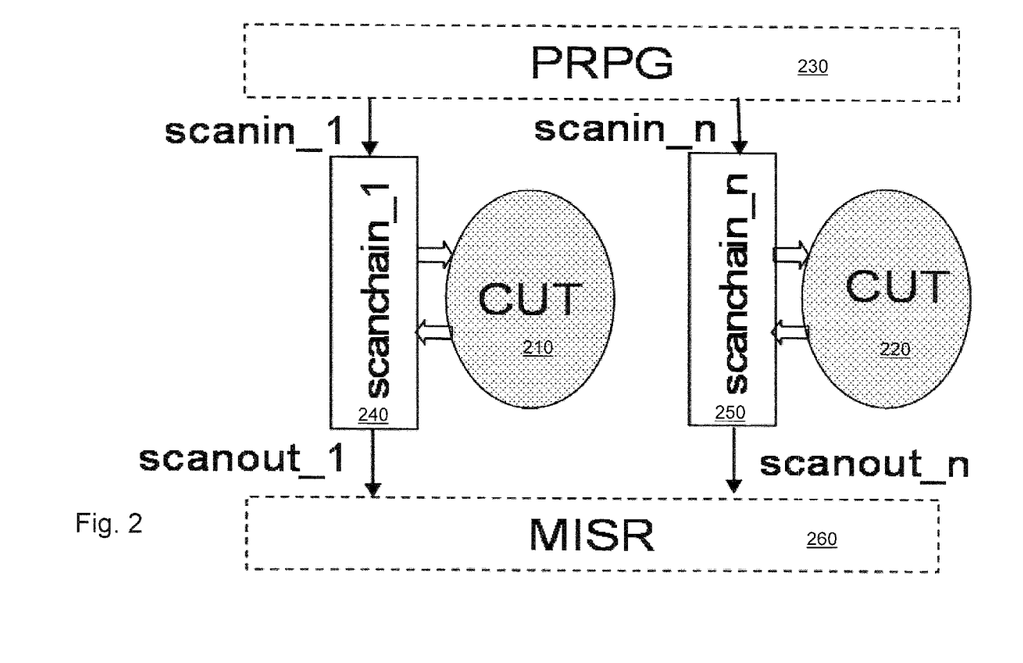
FIG. 2 is a block diagram of a conventional LBIST module.

FIG. 2 shows a popular LBIST architecture, the so-called "STUMPS" (Self-Testing Using an MISR and Parallel Shift Register Sequence Generator) architecture (see, e.g., Bardell, et al., "Self-Testing of Multichip Logic Modules," IEEE International Test Conference, 1982, pp. 200-204). Circuits-under-test (CUTs) 210, 220 (representing any number of CUTs) are functional circuits in the electronic system that are to be the subject of periodic testing. Many of the transistors in a typical IC are likely to be found in scan chains. Therefore, scan chains are likely locations of open defects. LBIST may be used to apply flush tests to scan chains to test them for open defects.

According to one testing technique, a pseudo-random pattern generator (PRPG) 230 generates and shifts pseudo-random patterns ("scanin_1" through "scanin_n") into scan chains 250, 260 ("scanchain_1" through "scanchain_n") corresponding to the CUTs 210, 220 using a scan clock signal (not shown) until the scan-chains 240, 250 are filled. Multiple functional clock signals are then applied at-speed to detect faults in the CUTs 210, 220. Results of the tests ("scanout_1" through "scanout_n") are then shifted from the scan-chains 240, 250 into a multiple-input scan register (MISR) 260 to yield a signature that can be analyzed. This testing technique is called test-per-scan LBIST.

In a different testing technique, called in-situ, or sometimes test-per-clock, LBIST, the PRPG 230 drives all the inputs of the CUTs 210, 220 and changes state once per clock cycle. A number of different variants of in-situ LBIST are possible. Among them are built-in logic block observation, or BILBO (see, e.g., Konemann, et al., "Built-in Logic Block Observation Techniques," IEEE International Test Conference, 1979, pp. 37-41) and circular self-test path, or CSTP (see, e.g., Pilarski, et al., "Estimating Testing Effectiveness of Circular Self-Test Path Technique," IEEE Transactions on Computer-Aided Design, Vol. 11, No. 10, pp. 1301-1316).

Figure 3A:
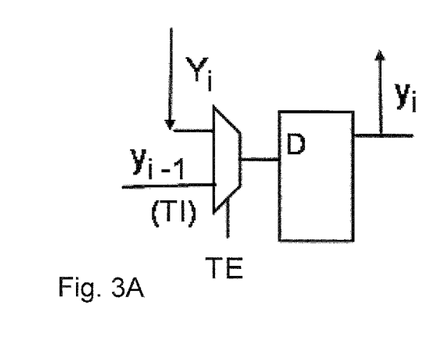
FIGS. 3A-C are schematic diagrams of a scan flip-flop and state elements, such as D flip-flops.
Figure 3B:
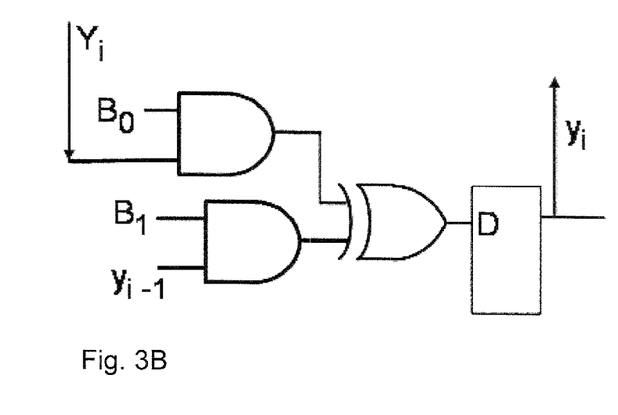
Figure 3C:
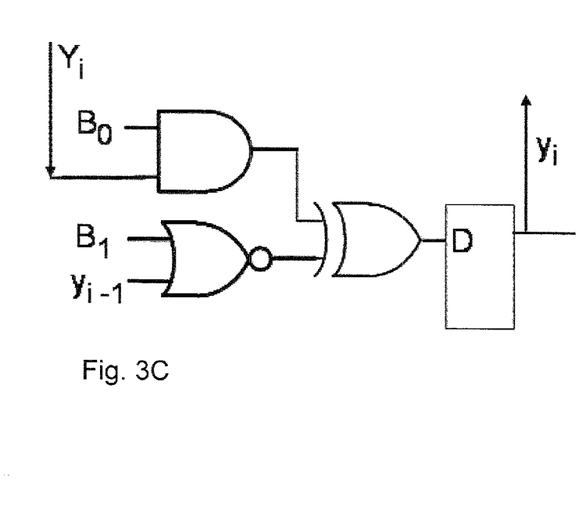

Irrespective of the testing technique employed, flip-flops are modified in the CUTs 210, 220 to allow the pseudo-random patterns to be introduced into, and the results to be extracted from, the functional CUTs 210, 220. FIG. 3A shows one example of a scan flip-flop. State elements, such as D flip-flops, may be modified as shown in FIGS. 3B and 3C. In FIGS. 3A-C, $y_i$ represent inputs to the CUT, and $Y_i$ represent outputs of the CUT. For BILBO, the values of control variables $B_0$, $B_1$ determine the mode of the state elements, viz., functional, scan shift, pattern generation or response compressions. For CSTP, the values of the control variables $B_0$, $B_1$ determine the mode of the state elements, viz., functional, scan shift or response compression. In both cases, the scan shift operation is applied primarily to initialize the contents of the PRPG 230 of FIG. 2 and shift out a compressed signature.

SUMMARY

One aspect of the invention provides an LBIST module and a method of online system testing. In one embodiment, the LBIST module includes: (1) first and second data sources selectable to provide alternative respective first and second data to at least one scan chain and (2) a scan clock modifier associated with the first and second data sources and configured to drive the at least one scan chain with a selectively aperiodic modified scan clock signal. In another embodiment, the LBIST module includes: (1) first and second data sources selectable to provide alternative respective first and second data to at least one scan chain, the first data source including a pattern modifier, and the second data source including a flush data generator and (2) a scan clock modifier associated with the first and second data sources and configured to generate a selectively aperiodic modified scan clock signal by selecting one from the group consisting of: (2a) an original clock signal, (2b) a half-speed flush test clock signal and (2c) a clock signal frozen at 0 or 1 over multiple original clock signal periods, and drive the at least one scan chain therewith.

Another aspect of the invention provides a method of online system testing. In one embodiment, the method includes: (1) alternatively providing respective first and second data to at least one scan chain and (2) driving the at least one scan chain with a selectively aperiodic modified scan clock signal.

The foregoing has outlined certain aspects and embodiments of the invention so that those skilled in the pertinent art may better understand the detailed description of the invention that follows. Additional aspects and embodiments will be described hereinafter that form the subject of the claims of the invention. Those skilled in the pertinent art should appreciate that they can readily use the disclosed aspects and embodiments as a basis for designing or modifying other structures for carrying out the same purposes of the invention. Those skilled in the pertinent art should also realize that such equivalent constructions do not depart from the scope of the invention.

BRIEF DESCRIPTION OF THE DRAWINGS

For a more complete understanding of the invention, reference is now made to the following descriptions taken in conjunction with the accompanying drawings, in which.

DETAILED DESCRIPTION OF CERTAIN ASPECTS AND EMBODIMENTS

In the existing LBIST solutions, it has been assumed that the process of shifting in a very large number of patterns through the scan chains and applying them at-speed over two or more clock cycles detects all open defects both in the scan chains and the CUTs. However this assumption is invalid. For this reason, existing LBIST solutions are inadequate.

Table 1, below, shows the number of cells and transistor counts of an example electronic system. The second row of Table 1 shows the number of combinational gates, latches and scan flip-flops in the circuit. The third row of Table 1 shows the number of transistors in each cell type. Only about 14.3% of the cells are scan cells, but those scan cells contain about 43.5% of the transistors. Therefore, scan cells would be expected to contain about 43.6% of the open defects that the example electronic system as a whole would be expected contain.

TABLE 1

Cells and Transistors in an Example System

|  | Combinatorial Gates | Latches | Scan Flip-flops |
|---|---|---|---|
| Cells | 3678245 | 3256 | 614159 |
|  | (85.6%) | (0.08%) | (14.3%) |
| Transistors | 30634354 | 53588 | 23670019 |
|  | (56.4%) | (0.1%) | (43.5%) |

This is similar to what may be encountered in a system using the LBIST module of FIG. 2. The PRPG 230 and MISR 240 contribute additional flip-flops to the overall system.

Figure 4:
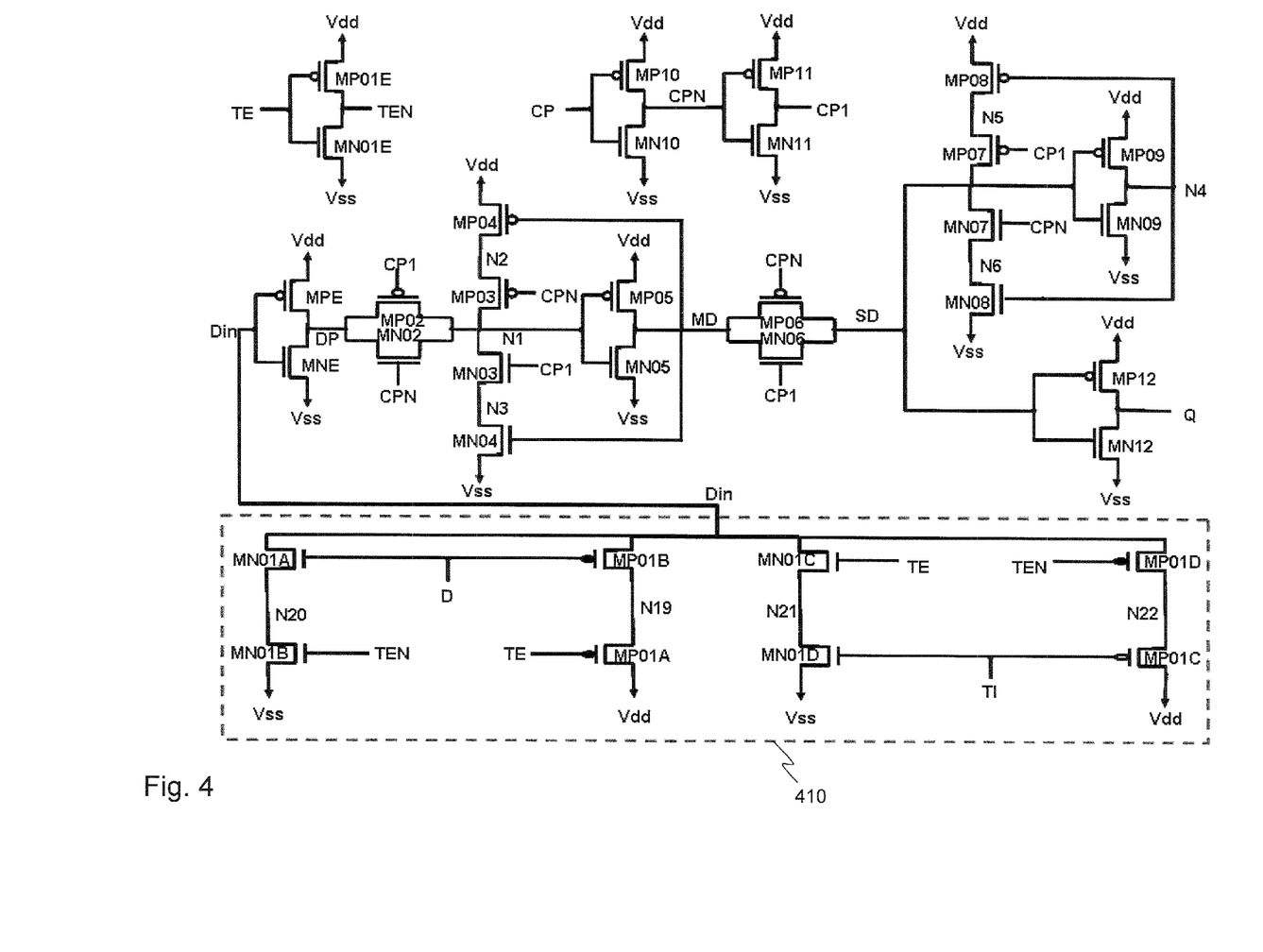
FIG. 4 is a schematic diagram of an example of a scan implementation.

Assuming a scan implementation such as that shown in FIG. 4, and assuming the pseudo-random patterns applied to the CUTs are theoretically adequate to detect 100% of any open defects, it has been discovered that the existing LBIST technique still detects only about 55.87% of any open defects. Thus, the gap in coverage of open defects is about 44.13% for the scan rains. Using the data from Table 1, this translates to a gap of about 19.19% for the overall system.

As stated above, undetected open defects can cause the circuit, and ultimately the electronic system as a whole, to fail in its functional mode. Some open defects only cause intermittent failures and are therefore difficult to detect. System failures become even more critical when power saving methods, such as clock-gating, are used. Thus, it is important to detect the remaining about 44.13% of the open defects and self-test modules must detect these faults.

Introduced herein are a novel LBIST module and method that, in certain embodiments, substantially reduce the number of undetected open defects. The module and method employ a novel sequence of tests, called a scan open defect flush test. Various embodiments of a novel LBIST module will be described.

Figure 5A:
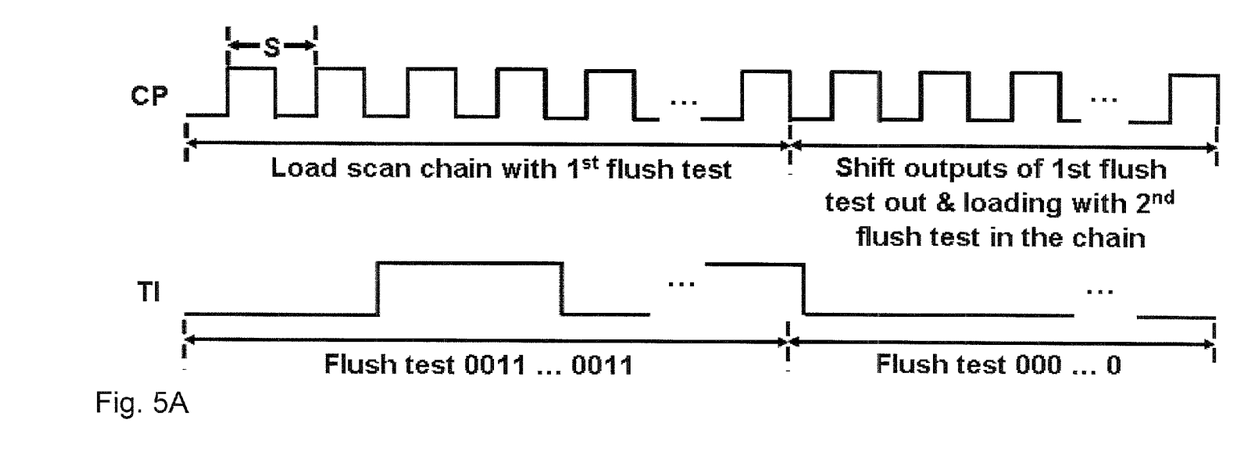
FIGS. 5A-B are timing diagrams illustrating flush tests and half-speed flush tests.
Figure 5B:
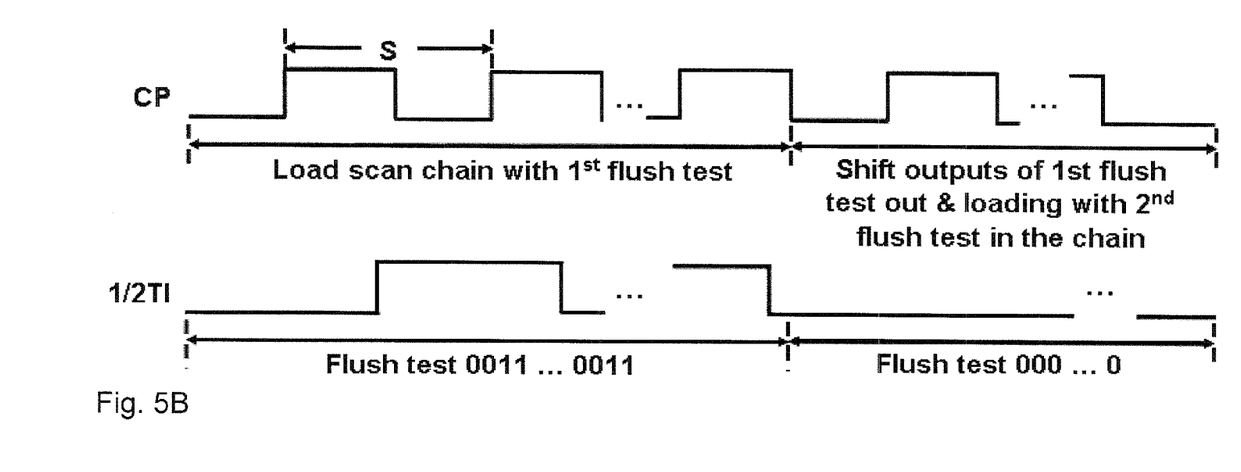

In the context of scan testing, a set of tests called "flush tests" are applied. Before describing certain embodiments of the novel module and method, (full-speed) flush tests and half-speed flush tests will be described. FIGS. 5A and 5B are timing diagrams illustrating flush tests and half-speed flush tests.

Assuming that the shift mode operation of the scan chain has been timing closed for a shift clock signal with a period T, shifts of scan chains to apply tests and observe test responses are done, both in LBIST and traditional scan based external test, using a clock signal of period T. The waveforms of the clock signal (CP) and scan_in signal (TI) in FIGS. 5A and 5B show the application of the flush test 0011 . . . 0011 followed by 000 . . . 0. The tests are applied to the scan chain at shift cycle time S equal to T. While the second test is shifted in, the values stored in the scan cells are shifted out and compared with the expected value. Shifting continues for K additional clock cycles, where K is the length of the scan chains.

In the context of LBIST, flush tests are not explicitly applied. However, flush tests are an implicit part of LBIST tests when random patterns are shifted in to fill the scan chain. If a scan chain fault that is detectable by a flush test occurs, the fault will corrupt the vector applied by LBIST to the CUT. Consequently, the response of the CUT to the corrupted pattern is such as to be faulty, and this is detected by the MISR.

FIG. 5B shows a timing diagram for half-speed flush tests. If it is assumed that scan chain timing was closed for the time period T, the half-speed flush test clock signal has a time period 2T. Such tests are capable of detecting at least some previously undetectable stuck-at and stuck-on defects.

Novel Scan Open Defect Flush Test

By using an enhanced set of scan based tests it is possible to increase the coverage of open defects such that it becomes possible to detect all detectable faults in the scan cell shown in FIG. 3 are detected. The enhanced sets of tests are shown in Tables 2 and 3, below.

The tests in Table 2 are flush tests. Novel aspects of these tests include: (1) the order of application of the tests, (2) the requirements on the period of the shift clock signal, and (3) holding of the scan clock signal at 0 and at 1 for a period of several clock cycles. The first three tests in Table 2 are the standard flush tests but should be applied in the order given rather than an arbitrary order as typically done in standard test suites. After the application of the three flush tests, the shift clock signal should be held at logic 1 for duration of M clock cycles. This is done to insure charging of the clock lines of the scan cells to 1 even in the presence of an open defect. Next the flush test 00110 . . . is applied again, and the clock signal is held at 0 for a duration of N clock cycles. This is followed by a half-speed flush test 0101 . . . 01. Finally, a two bit flush test 01 is applied at a substantially lower frequency.

For the example 90 nanometer design of Table 1, the timing closure clock period for the scan chains is 10 nanoseconds. Thus the half-speed flush tests are applied at a clock period of 20 nanoseconds. A duration of 15 clock cycles over which the clock signal is held at 1 and 0 as described above was found to be sufficient to pre-charge the clock nodes to 0, 1. So, N=15 in Table 2. A 1 microsecond clock period for the final two bit flush test was determined to be sufficient. This last flush test is needed to test for data retention faults in the scan cells.

TABLE 1

Scan Open Defect Flush Tests

| Tests | Comments |
| --- | --- |
| 11 . . . 1 | Flush tests are conducted in this order |
| 00 . . . 0 | |
| 0011 . . . 0011 | |
| Hold clock signal at 1 for M cycles | Flush test after pre-charging clock lines to 1 |
| 0011 . . . 0011 | |
| Hold clock signal at 0 for N cycles | Half-speed flush test after pre-charging clock lines to 0 |
| Half-speed flush test 0101 . . . 01 | |
| Apply 01 slow for two cycles | Slow speed flush test |

Note that the scan open defect test sequence is independent of the circuit implementation, and as described below, is amenable to straightforward LBIST periodic testing. Other known sequences, such as checking sequences described in Makar, at al., "Checking Experiments to Test Latches," Proc. VLSI Test Symp., pp. 196-201, 1995, and Makar, et al., "Checking Experiments for Scan Chain Latches and Flip-flops," CRC Technical Report 96-5, August 1996) are dependent on the circuit implementation. They are also not amenable to straightforward LBIST periodic testing.

A Novel LBIST Module

Flush tests, with various clock signal controls and carefully ordered patterns, are desired to maximize open defect coverage. As has been shown, detecting as many open defects as possible minimizes the risk that the electronic system as a whole will fail during its functional mode as a result of a latent open defect. During manufacturing testing, if scan top-off patterns are used in conjunction with LBIST, such patterns can be applied from automated test equipment. In contrast, the automated test equipment is not available for system testing, only the LBIST structure is available to test for these potential field failures. Thus, LBIST needs to be augmented to apply the scan novel open defect flush test sequence.

Figure 6:
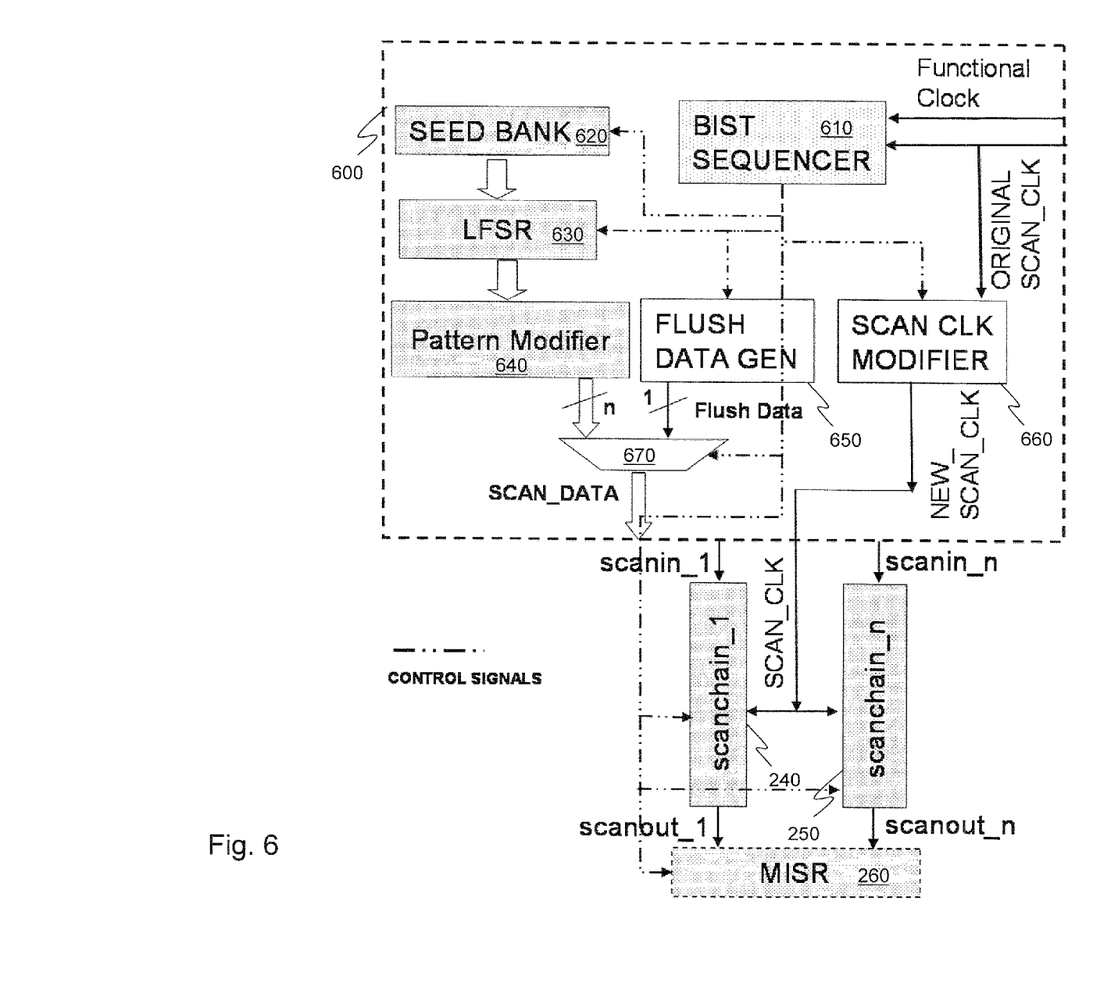
FIG. 6 is a block diagram showing one embodiment of a novel LBIST module constructed according to the principles of the invention.

FIG. 6 shows one embodiment of a novel LBIST module. Although not shown in FIG. 2, the PRPG 230 of FIG. 2 includes a BIST sequencer, a seed bank, a linear feedback shift register (LFSR) and a pattern modifier. In FIG. 6, a PRGP 600 enhances the PRPG 230 of FIG. 2 with several novel functional elements.

A BIST sequencer 610 not only performs the functions of the BIST sequencer of the PRGP 230 of FIG. 2 but also performs additional, novel functions. The BIST sequencer 610 is configured to receive clock signals and drive the various functional elements and the MISR 240. In addition, the BIST sequencer 610 is configured to start the LBIST operation, sequence through the various stages of the LBIST test session and indicate the completion of the test session. More specifically, in one embodiment, the BIST sequencer 610 is configured to scan in timing delay fault (TDF) and path-delay patterns provided by the pattern modifier 640 and apply them at-speed to the CUTs. In doing so, the BIST sequencer 610 generates a TE_OLD signal and a FUNC_CLK_OLD signal. The BIST sequencer 610 uses the ORIGINAL_SCAN_CLOCK signal and the functional clock signal to generate these patterns. The BIST sequencer 610 also controls the MISR 240 to accumulate the results, compare it with the expected results and generate the error signal. FIG. 6 does not explicitly show this.

A seed bank 620 is coupled to the BIST sequencer 610. In some embodiments, a weight modifier (not shown) is coupled to the seed bank 620. An LFSR 630 is coupled to the seed bank 620 and configured to provide shifted pseudo-random sequences to a pattern modifier 640. In the illustrated embodiment, the seed bank 620, the LFSR 630 and the pattern modifier 640 are configured to function as they did in the PRPG 230 of FIG. 2, namely to function as a first data source for the flush tests, providing a PATTERN_MODIFIER signal. A flush data generator 650 and a scan clock modifier 660 are coupled to the BIST sequencer 610. The flush data generator 650 functions as an additional data source for the flush tests, providing a FLUSH_DATA_GENERATOR signal. A multiplexer SCAN_DATA MUX 670 selects between these two data sources, driving the scan chains 250, 260 with the selected data source. The scan clock modifier 660 also provides its output, a modified scan clock signal NEW_SCAN_CLK that is based on the original scan clock signal ORIGINAL_SCAN_CLK, to the scan chains 250, 260. The scan clock modifier 660 is configured to slow the clock signal for a half-speed test or a very slow speed test and freeze the clock signal at either 0 or 1 for an extended period of time, e.g., over multiple ORIGINAL_SCAN_CLK cycles. Thus, NEW_SCAN_CLK is selectively aperiodic.

Embodiments of the Novel LBIST Module

Figure 7:
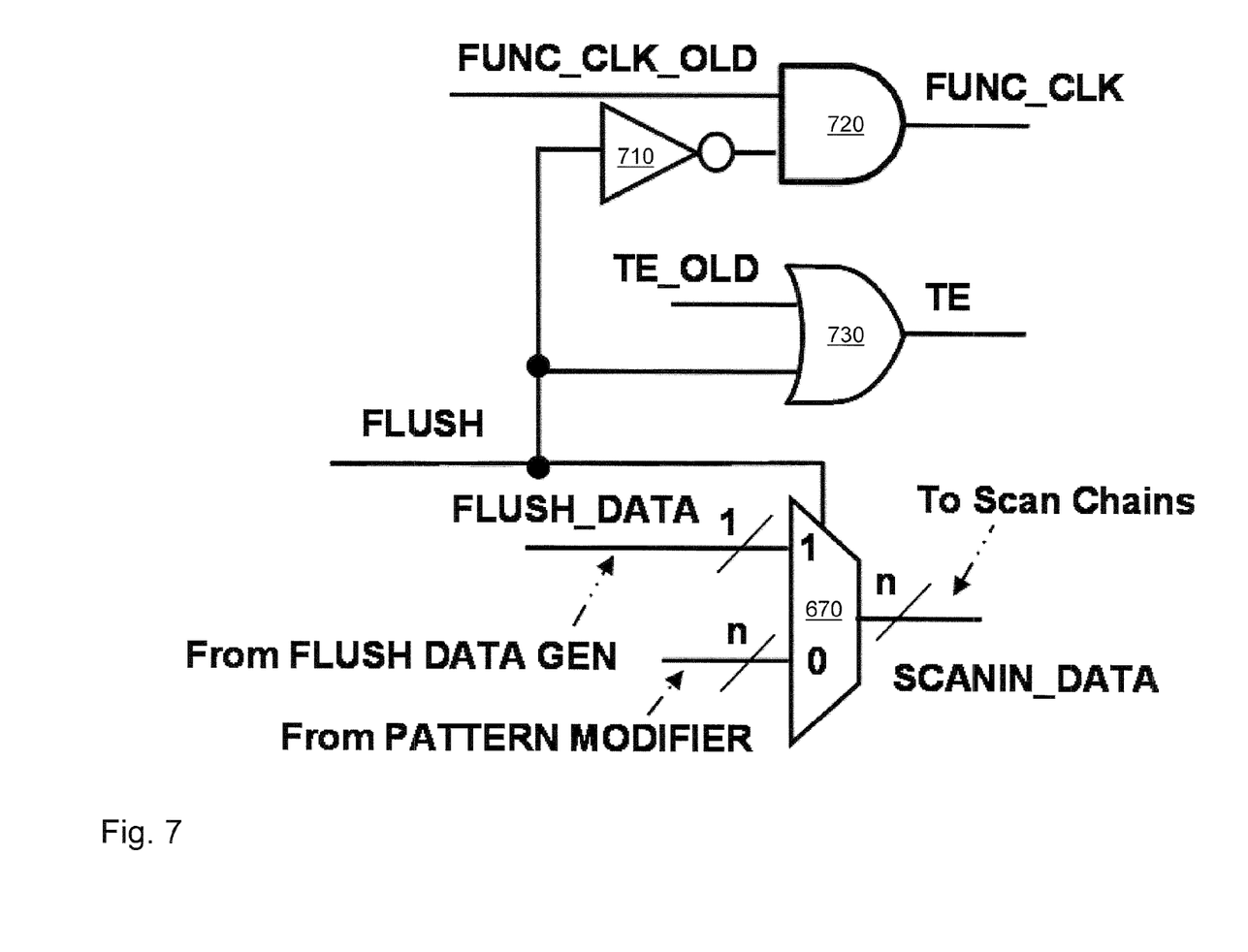
FIG. 7 is a schematic diagram of a circuit configured to generate TE from TE_OLD and FUNC_CLK from FUNC_CLK_OLD and indicating how a multiplexer SCAN_DATA MUX may operate.
Figures 8, 9:
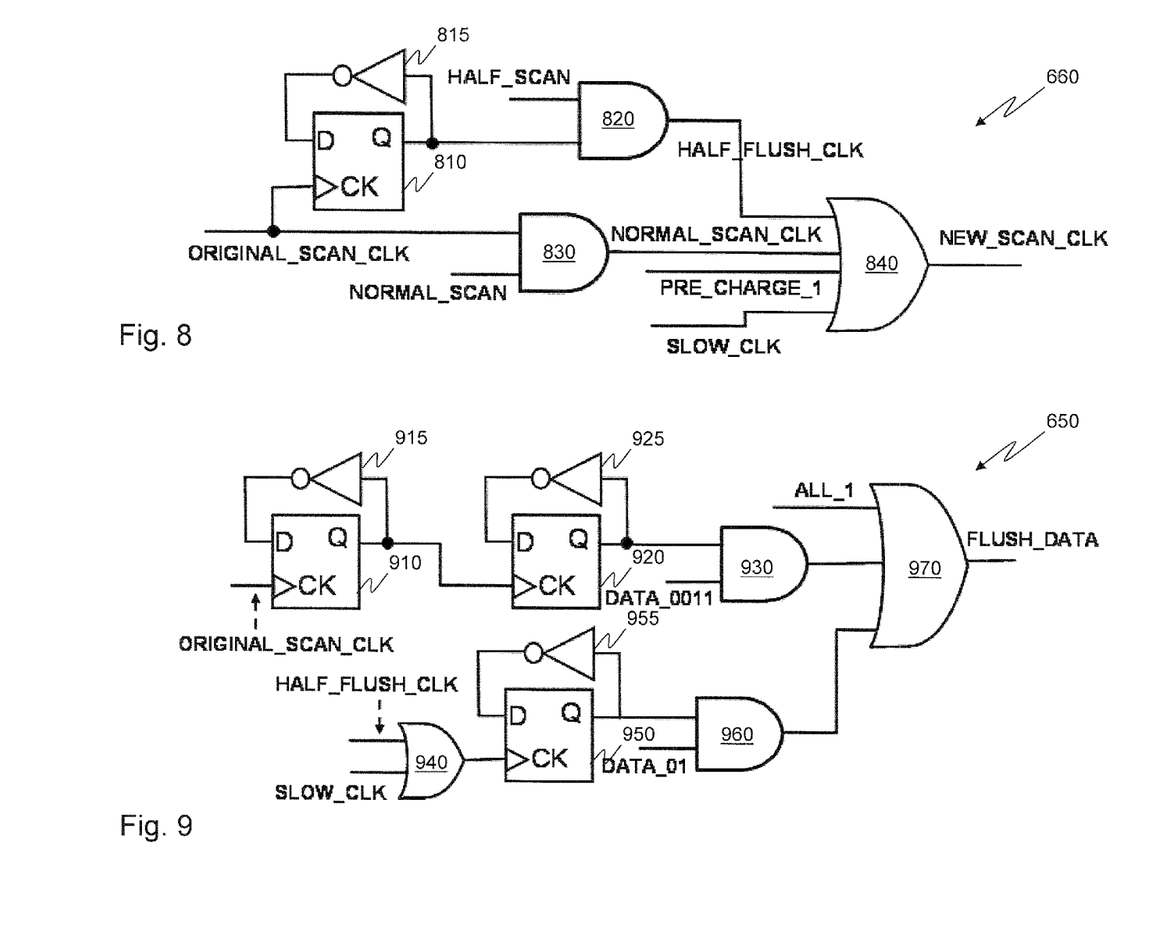
FIG. 8 is a schematic diagram of one embodiment of a scan clock modifier constructed according to the principles of the invention.
FIG. 9 is a schematic diagram of one embodiment of a flush data generator constructed according to the principles of the invention.

FIGS. 7, 8 and 9 show one embodiment of an LBIST module constructed according to the principles of the invention. More specifically, FIG. 7 is a schematic diagram of a circuit configured to generate TE from TE_OLD and FUNC_CLK from FUNC_CLK_OLD and indicating how the multiplexer SCAN_DATA MUX 670 may operate.

FIG. 6 will continue to be referenced. As stated above, the BIST sequencer 610 is configured to generate the TE_OLD and FUNC_CLK_OLD control signals. The BIST sequencer 610 is also configured to generate two control signals, TE and FUNC_CLK. An inverter 710, an AND gate 720 and an OR gate 730 may be used to generated the latter signals. The FLUSH signal identifies whether or not the BIST sequencer 610 is generating the scan open defect flush test of Table 2. In FIG. 7, the FLUSH signal is used to modify the TE_OLD and FUNC_CLK_OLD signals to generate the TE and FUNC_CLK signals. The TE and FUNC_CLK signals are provided to the scan chains 250, 260 and the MISR 240 of FIG. 6. The FLUSH signal is also used to select the data provided to the scan chains, either FLUSH_DATA_GENERATOR or PATTERN_MODIFIER.

The BIST sequencer 610 generates four control signals that control the scan clock modifier 660: NORMAL_SCAN, HALF_SCAN, PRECHARGE_1 and SLOW_CLOCK. These indicate, respectively, that the original (full speed) scan clock signal, the half-speed scan clock signal, the clock signal held to 1 and the slow clock signal are to be generated. Note that in the illustrated embodiment, no specific signal is used to cause the scan clock modifier 660 to hold the scan clock signal to 0. In the illustrated embodiment, the scan clock modifier 660 holds the scan clock signal to 0 if NORMAL_SCAN, HALF_SCAN, PRECHARGE_1 and SLOW_CLOCK are set to 0.

FIG. 8 shows one embodiment of the scan clock modifier 660. The scan clock modifier 660 employs a D flip-flop 810, an inverter 815, two AND gates 820, 830 and an OR gate 840. As described above, the scan clock modifier 660 produces a new scan clock signal, NEW_SCAN_CLK. NEW_SCAN_CLK is used to drive the scan chains 250, 260. The BIST sequencer 610 generates a set of control signals to control the flush data generator 650: ALL_1, DATA_OO11, DATA_01. ALL_1 indicates that the flush test 111 . . . 111 is to be generated, DATA_0011 indicates that the flush test 0011 . . . 0011 is to be generated, and DATA_01 indicates that the flush test 01 . . . 01 is to be generated. Note that this embodiment has no specific signal for the flush test 000 . . . 000. In this embodiment, the flush test 000 . . . 000 is to be generated if ALL_1, DATA_OO11, DATA_01 are set to 0.

FIG. 9 shows one embodiment of the flush data generator 650. The flush data generator 650 employs three D flip-flops 910, 920, 950, three inverters 915, 925, 955, two AND gates 930, 960 and two OR gates 940, 970. The flush data generator 650 may also use ALL_1, DATA_OO11, DATA_01 as shown in FIG. 9. Note that a free flow of 0011 . . . 0011 and 0101 . . . 01 patterns are being generated from clock signals. HALF_FLUSH_CLK is the half-speed scan clock signal generated within the scan clock modifier 660 of FIG. 8.

Figure 10:
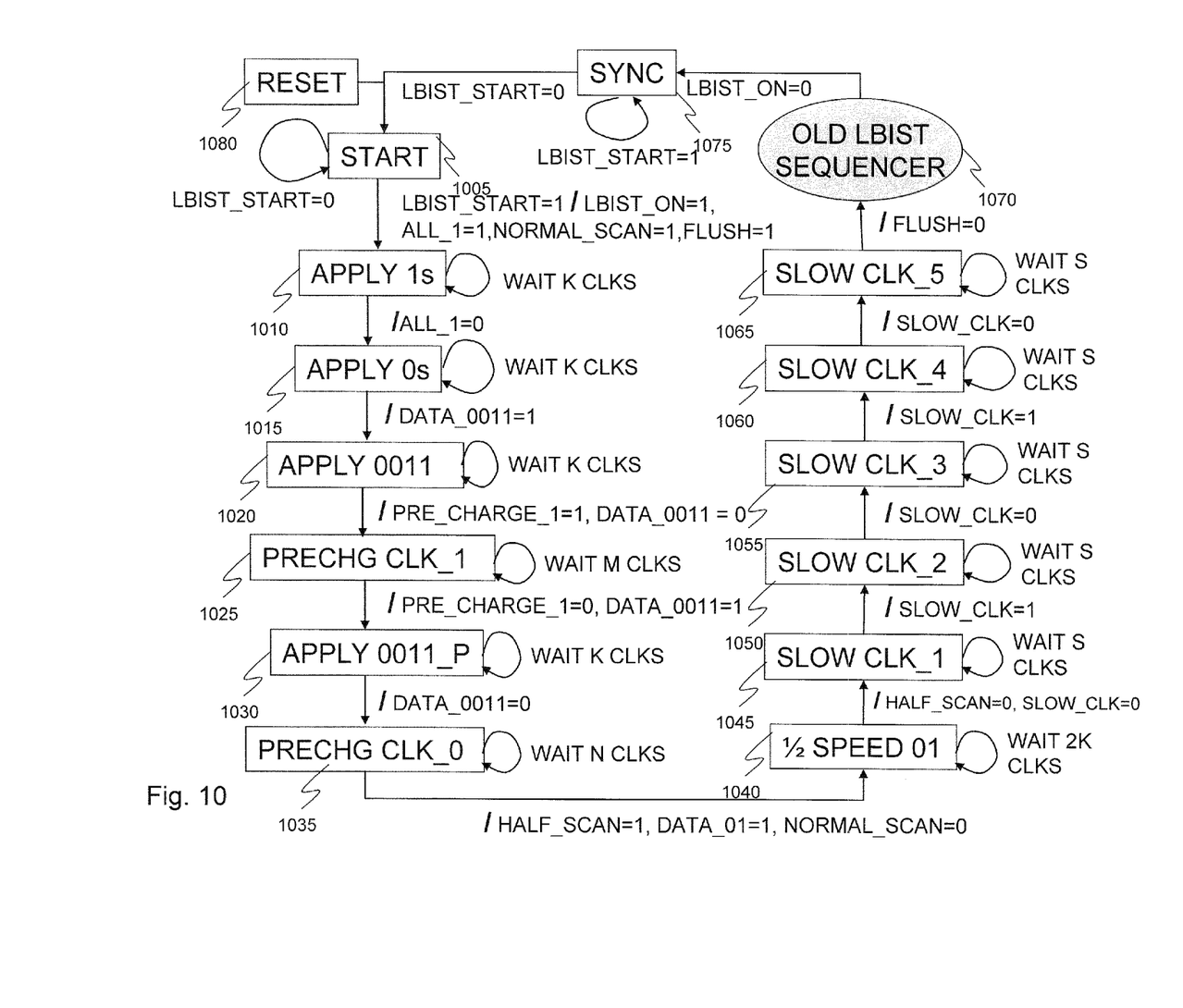
FIG. 10 is a state diagram defining the operation of one embodiment of a BIST sequencer constructed according to the principles of the invention.

FIG. 10 is a state diagram defining the operation of one embodiment of the BIST sequencer 610. A definition of the BIST_SEQUENCER that generates the various control signals is shown in FIG. 10. On power up, a RESET state 1080 is entered, in which the following control signals are set to 0: NORMAL_SCAN, FLUSH, HALF_SCAN, NORMAL_SCAN, PRE_CHARGE_1, SLOW_CLK, ALL_1, DATA_0011, DATA_01 and LBIST_ON. The following notation is used to label the edges: <a, b, . . . >/<x, y, . . . >. Here, the "a, b, . . . " before the "/" are the list of signal-value pairs that causes a transition to occur, and the "x, y, . . . " after the "/" are the signal-value pairs that result from the transition. For example, the transition from a "START" state 1005 to an "APPLY 1s" state 1010 occurs when LBIST_START=1, and this transition causes LBIST_ON, ALL_1, NORMAL_SCAN, FLUSH to be set to 1. Further states 1015, 1020, 1025, 1030, 1035, 1040, 1045, 1050, 1055, 1060, 1065 call for tests, precharges and clock signals of different rates to be applied as shown. It is assumed that all outputs are latched, but this need not be the case.

In the embodiment of FIG. 10, an old LBIST sequencer 1070 is a conventional BIST sequencer. Once the scan open defect flush test is applied, the old LBIST sequencer takes control. In an alternative embodiment, the scan open defect flush test is combined with other BIST functions to yield an integrated BIST sequencer.

The state diagram of FIG. 10 uses the symbols K, M, N, and S which are defined in Table 3, below. With this background the state diagram of FIG. 10 is self-explanatory. The state diagram includes a SYNC state 1075 to synchronize with a global LBIST controller (not shown) and wait for the global LBIST controller to reset the LBIST_START signal before moving on to the START state 1005.

TABLE 2

Parameters for BIST_SEQUENCER

| | |
|---|---|
| K | Number of scan clock cycles to fill the scan chain |
| M | Number of scan clock cycles required to precharge the clock node to 1 |
| N | Number of scan clock cycles required to precharge the clock node to 0 |
| $T_{slow}$ | Period of the slow clock signal |
| $T_{scan}$ | Period of the scan clock signal |
| 2S | $T_{slow}/T_{scan}$ |

From the above, it is apparent that various embodiments of the invention provide a scan open defect flush test that is effective in detecting open defects in the scan chains that cause functional failures. Such faults have to be detected during periodic testing. The coverage of such faults increases from about 55.87% to about 92%. The remaining about 8% of faults are in transmission gates of flip-flops, which are not detectable.

The disclosed scan open defect flush test is a CUT-independent sequence for which an on-chip generator can be designed. Certain embodiments of the novel LBIST module have been set forth. The embodiments have been generally described in the context of discrete logic hardware, but those skilled in the pertinent art will readily understand that the same or equivalent functions may be carried out in a sequence of software instructions executable in a processor, e.g., an embedded processor, without departing from the scope of the invention.

Those skilled in the art to which the invention relates will appreciate that other and further additions, deletions, substitutions and modifications may be made to the described embodiments without departing from the scope of the invention.

What is claimed is:

1. A logic built-in self-test (LBIST) module, comprising:
    first and second data sources selectable to provide alternative respective first and second data to at least one scan chain; and
    a scan clock modifier associated with said first and second data sources and configured to drive said at least one scan chain with a selectively aperiodic modified scan clock signal.

2. The LBIST module as recited in claim 1 further comprising said at least one scan chain and a multiple input shift register coupled thereto, said first and second data sources, said scan clock modifier and said at least one scan chain configured to cooperate to carry out a scan open defect flush test.

3. The LBIST module as recited in claim 1 further comprising a built-in self-test (BIST) sequencer configured to drive said first and second data sources and said scan clock modifier.

4. The LBIST module as recited in claim 1 wherein said first data source comprises a seed bank, a linear feedback shift register and a pattern modifier.

5. The LBIST module as recited in claim 1 wherein said second data source comprises a flush data generator.

6. The LBIST module as recited in claim 1 further comprising a multiplexer coupled to said first and second data sources and configured to select between outputs thereof.

7. The LBIST module as recited in claim 1 wherein said scan clock modifier is configured to generate said selectively aperiodic modified scan clock signal by selecting one from the group consisting of:

an original clock signal, a half-speed flush test clock signal, and a clock signal frozen at 0 or 1 over multiple original clock signal periods.

8. A method of online system testing, comprising:

alternatively providing respective first and second data to at least one scan chain; and driving said at least one scan chain with a selectively aperiodic modified scan clock signal.

9. The method as recited in claim 8 further comprising carrying out a scan open defect flush test with said first and second data sources, said scan clock modifier, said at least one scan chain and a multiple input shift register coupled to said at least one scan chain.

10. The method as recited in claim 8 further comprising driving said first and second data sources and said scan clock modifier with a built-in self-test (BIST) sequencer.

11. The method as recited in claim 8 wherein said first data source comprises a seed bank, a linear feedback shift register and a pattern modifier.

12. The method as recited in claim 8 wherein said second data source comprises a flush data generator.

13. The method as recited in claim 8 further comprising selecting between outputs of said first and second data sources with a multiplexer.

14. The method as recited in claim 8 wherein said driving comprises generating said selectively aperiodic modified scan clock signal by selecting one from the group consisting of:

an original clock signal, a half-speed flush test clock signal, and a clock signal frozen at 0 or 1 over multiple original clock signal periods.

15. A logic built-in self-test (LBIST) module, comprising:

first and second data sources selectable to provide alternative respective first and second data to at least one scan chain, said first data source including a pattern modifier, and said second data source including a flush data generator; and a scan clock modifier associated with said first and second data sources and configured to generate a selectively aperiodic modified scan clock signal by selecting one from the group consisting of:

an original clock signal, a half-speed flush test clock signal, and a clock signal frozen at 0 or 1 over multiple original clock signal periods, and drive said at least one scan chain therewith.

16. The LBIST module as recited in claim 15 further comprising said, at least one scan chain and a multiple input shift register coupled thereto, said first and second data sources, said scan clock modifier and said at least one scan chain configured to cooperate to carry out a scan open defect flush test.

17. The LBIST module as recited in claim 15 further comprising a built-in self-test (BIST) sequencer configured to drive said first and second data sources and said scan clock modifier.

18. The LBIST module as recited in claim 15 wherein said first data source further includes a seed bank and a linear feedback shift register.

19. The LBIST module as recited in claim 15 further comprising a multiplexer coupled to said first and second data sources and configured to select between outputs thereof.

20. The IBIS module as recited in claim 15 wherein said LBIST module is part of an integrated circuit including circuits-under-test (CUTs) and said at least one scan chain is associated with a corresponding one of said CUTs.

* * * * *